US006177307B1

(12) United States Patent
Tu et al.

(10) Patent No.: US 6,177,307 B1
(45) Date of Patent: Jan. 23, 2001

(54) PROCESS OF PLANARIZING CROWN CAPACITOR FOR INTEGRATED CIRCUIT

(75) Inventors: Yeur-Luen Tu, Taichung; Yuan-Hung Liu, Hsinchu, both of (TW)

(73) Assignee: Worldwide Semiconductor Corporation, Hsinchu (TW)

( * ) Notice: Under 35 U.S.C. 154(b), the term of this patent shall be extended for 0 days.

(21) Appl. No.: 09/392,158

(22) Filed: Sep. 8, 1999

(30) Foreign Application Priority Data

Jul. 27, 1999 (TW) ........................................ 88112675

(51) Int. Cl.[7] ........................................ H01L 21/8242

(52) U.S. Cl. ........................ 438/241; 438/279; 438/253; 438/396

(58) Field of Search ........................ 438/239, 241, 438/253, 254, 255, 279, 396, 397, 398

(56) References Cited

U.S. PATENT DOCUMENTS 5,858,831 * 1/1999 Sung ........................ 438/241
6,010,933 * 1/2000 Cherng ........................ 438/253
6,022,776 * 2/2000 Lien et al. ........................ 438/253
6,077,738 * 6/2000 Lee et al. ........................ 438/241
6,077,742 * 6/2000 Chen et al. ........................ 438/255
6,121,082 * 9/2000 Linliu et al. ........................ 438/253

* cited by examiner

*Primary Examiner*—Charles Bowers
*Assistant Examiner*—Jack Chen
(74) *Attorney, Agent, or Firm*—Fish & Richardson P.C.

(57) ABSTRACT

A method for fabricating an integrated circuit having a cell area and a peripheral circuit area in a semiconductor substrate is disclosed. First, a memory device and a transistor are formed within the cell area and the peripheral circuit area, respectively, wherein the memory device has a doped region formed in the semiconductor substrate. Then, a first insulating layer is formed to overlie the cell area and the peripheral circuit area, and thereafter patterned to be a trench over the doped region and a recess in the peripheral circuit area. Next, the first insulating layer is patterned through the trench to form a contact window, and a landing plug is filled into the contact window in contact with the doped region. Subsequently, a second insulating layer and a third insulating layer are sequentially formed to overlie the cell area and the peripheral circuit area, and then patterned to form an opening over the doped region. Next, a first conductive layer is formed on the bottom and sidewall of the opening in contact with the landing plug. Then, the third insulating layer in the cell area is removed by a planarization process, and the second insulating layer in the cell area is thereafter removed. Finally, a dielectric layer and a second conductive layer are sequentially formed over the first conductive layer.

20 Claims, 8 Drawing Sheets

262 262 254 252 246 236 266 264 260 260 242 248 250 232 234 230 226 212 212 218 224 24 216 222 214 220 20 22 210 210 202 208 n+ n+ P+ P+ cell peripheral 200 24B 24A 204 20A 206

PROCESS OF PLANARIZING CROWN CAPACITOR FOR INTEGRATED CIRCUIT

BACKGROUND OF THE INVENTION

1. Field of the Invention

The present invention generally relates to semiconductor integrated circuit fabrication. More particularly, the present invention relates to a process of planarizing crown capacitors for integrated circuitry.

2. Description of the Related Art

The crown capacitor has been widely applied to the dynamic random access memory (DRAM), for providing sufficient capacitance as semiconductor devices scale down in size. In the conventional process of manufacturing the crown capacitor, the bottom electrode is configured with an inner sidewall and outer sidewall to be exposed, thus raising a planarization issue. To overcome this problem, one approach is to apply an additional chemical mechanical polishing (CMP) process after the inner sidewall and the outer sidewall of the bottom electrode has been exposed; the other approach makes use of a photoresist layer, formed through an extra photolithography process, to overlie the peripheral circuit area while insulating material is filled onto the exposed inner sidewall and outer sidewall in the cell area.

SUMMARY OF THE INVENTION

Therefore, it is an object of the present invention to provide a process for planarizing crown capacitors without an additional CMP step after the inner sidewall and the outer sidewall of the bottom electrode has been exposed.

It is another object of the present invention to provide a process for planarizing crown capacitors without an extra photolithography step to block the peripheral circuit area.

For achieving the above-identified objects, the present invention provides a method for fabricating an integrated circuit having a cell area and a peripheral circuit area in a semiconductor substrate. First, a memory device and a transistor are formed within the cell area and the peripheral circuit area, respectively, wherein the memory device has a doped region formed in the semiconductor substrate. Then, a first insulating layer is formed to overlie the cell area and the peripheral circuit area, and thereafter patterned to be a trench over the doped region and a recess in the peripheral circuit area. Next, the first insulating layer is patterned through the trench to form a contact window, and a landing plug is filled into the contact window in contact with the doped region. Subsequently, a second insulating layer and a third insulating layer are sequentially formed to overlie the cell area and the peripheral circuit area, and then patterned to form an opening over the doped region. Next, a first conductive layer is formed on the bottom and sidewall of the opening in contact with the landing plug. Then, the third insulating layer in the cell area is removed by a planarization process, and the second insulating layer in the cell area is thereafter removed. Finally, a dielectric layer and a second conductive layer are sequentially formed over the first conductive layer.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Referring to FIGS. 1A~1H, the process flow of fabricating an integrated circuit in accordance with one preferred embodiment of the present invention is schematically illustrated in cross-sectional views. The illustrated process flow is used to fabricate a memory device with capacitor over bit-line (COB) configuration. As shown in FIGS. 1A~1H, dotted lines are used to differentiate a cell area from a peripheral circuit area.

Figure 1A:
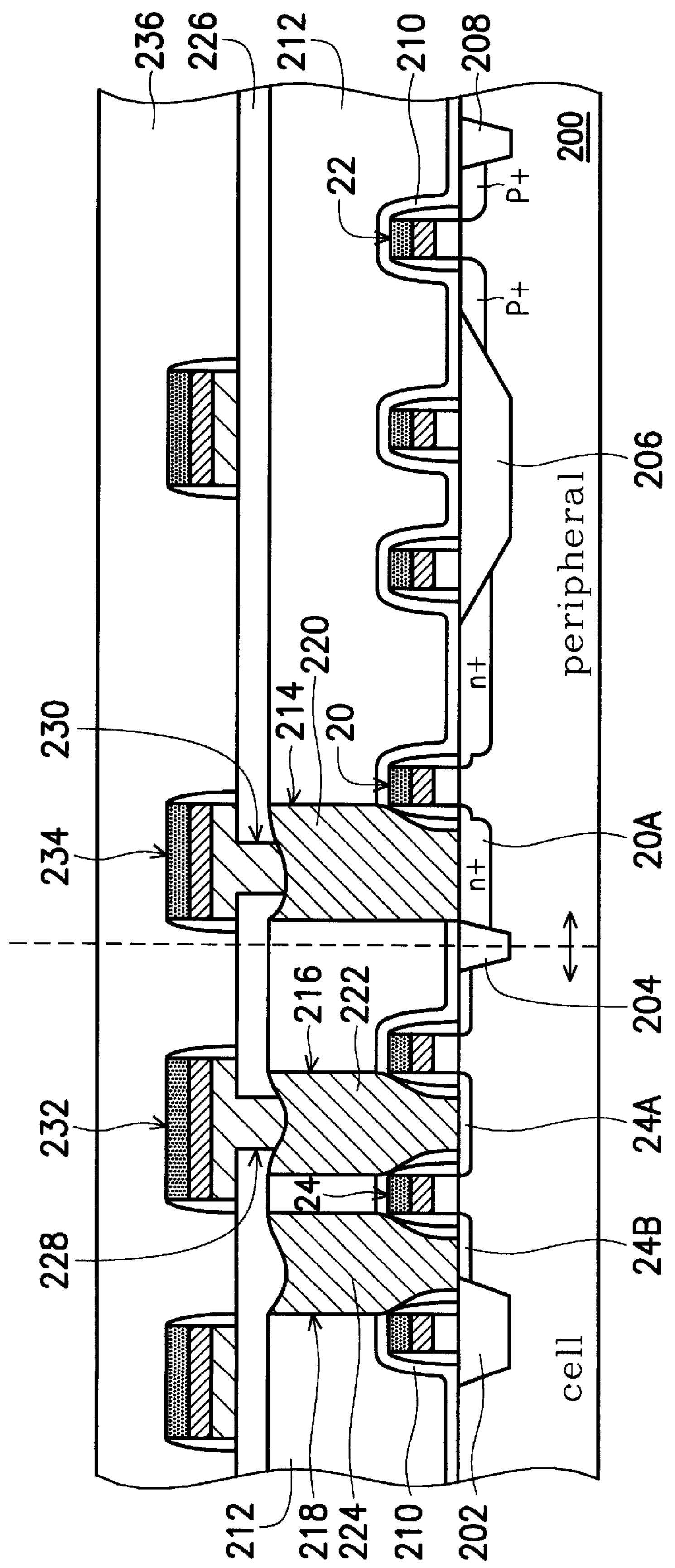
FIGS. 1A~1H schematically illustrate the process flow of one preferred embodiment according to the present invention in cross-sectional views.

As shown in FIG. 1A, a plurality of shallow trench isolation (STI) regions 202, 204, 206 and 208 are provided in a semiconductor substrate 200. An NMOS transistor 20 and a PMOS transistor 22 are formed within the extent of the peripheral circuit area. For example, the NMOS transistor 20 is formed between the STI regions 204 and 206, while the PMOS transistor 22 is formed between the STI regions 206 and 208. One memory device 24 is formed within the extent of the cell area. The memory device 24 can be a MOS transistor and, preferably, an NMOS transistor. All gate structures of the transistors 20, 22 and the memory device 24 are fabricated through the same process steps, including stacked layers of gate oxide, polysilicon or polysilicon/silicide, and nitride. Moreover, spacers of silicon nitride are formed on the sidewall of the gate structures. In FIG. 1A, reference numeral 210 designates a liner layer of silicon nitride.

In addition, an insulating layer 212 is thoroughly formed over the cell area and the peripheral circuit area. The insulating layer 212 can be a silicon oxide layer deposited by means of a low-pressure chemical vapor deposition (LPCVD) process. The insulating layer 212 is patterned and etched by means of photolithography and etching processes to form contact windows 214, 216 and 218 for exposing one source/drain region 20A of the NMOS transistor 20, and the doped regions 24A and 24B of the memory device 24, respectively. Landing plugs 220, 222, 224 are thereafter filled into the contact windows 214, 216 and 218, respectively. Usually, the landing plugs 220, 222, 224 consist of polysilicon doped with impurities to increase conductivity.

Further referring to FIG. 1A, an insulating layer 226 of LPCVD-deposited silicon oxide is thereafter formed over the insulating layer 212 and the landing plugs 220, 222 and 224. By means of photolithography and etching processes, the insulating layer 226 is patterned and etched to define bit-line contact window 228 and 230 and thus expose the landing plugs 222 and 220, respectively. Then, the bit-lines 232 and 234 are formed and electrically connected to the landing plugs 222 and 220 through the bit-lines contact windows 228 and 230, respectively. Preferably, the bit-line 232 and 234 are formed by the same process steps, including stacked layers of polysilicon or polysilicon/silicide, and nitride. Moreover, spacers of silicon nitride are formed on the sidewall of the bit-lines 232 and 234. Then, an insulating layer 236 is thoroughly deposited over the insulating layer 226 and the bit-lines 232 and 234.

Figure 1B:
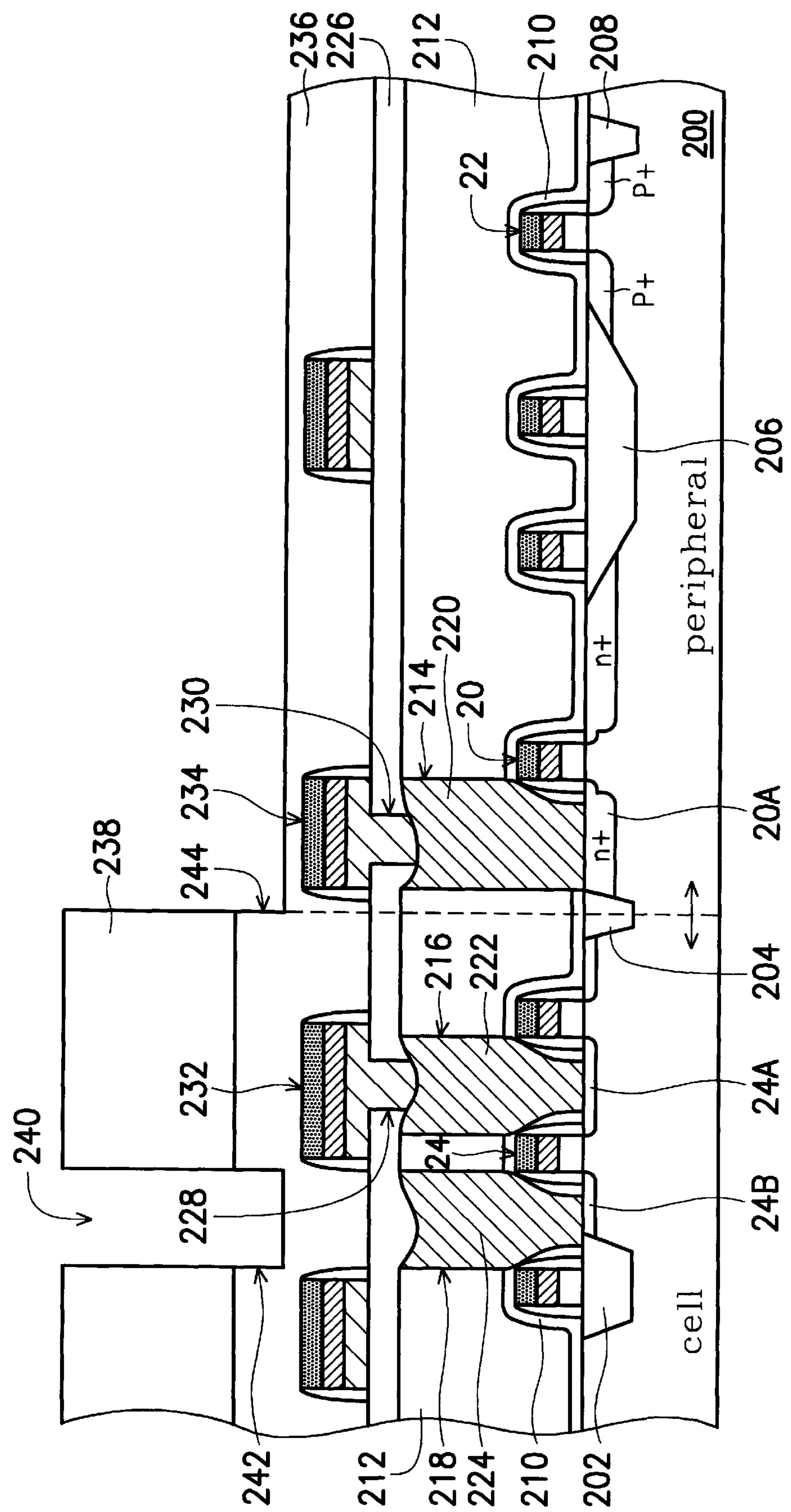

As shown in FIG. 1B, a photoresist layer 238 is formed by means of photolithography over the cell area only, and patterned to have an opening 240 corresponding to a storage node contact. The opening 240 has a width of about 0.25~0.35 $\mu$m. Then, by taking the patterned photoresist layer 238 as masking, portions of the insulating layer 236 not covered by the photoresist layer 236 are thinned by, for example, an etching step, in order to form a trench 242 over the landing plug 224 and a recess 244 over the peripheral circuit area. As an example, if the thickness of the insulating layer 236 of FIG. 1A above the top surface of the bit-lines 232 and 234 is in the range of about 3000~5000 Å, the depths of the trench 242 and the recess 244 can be of about 2000~4000 Å. The photoresist layer 238 is thereafter removed.

Figure 1C:
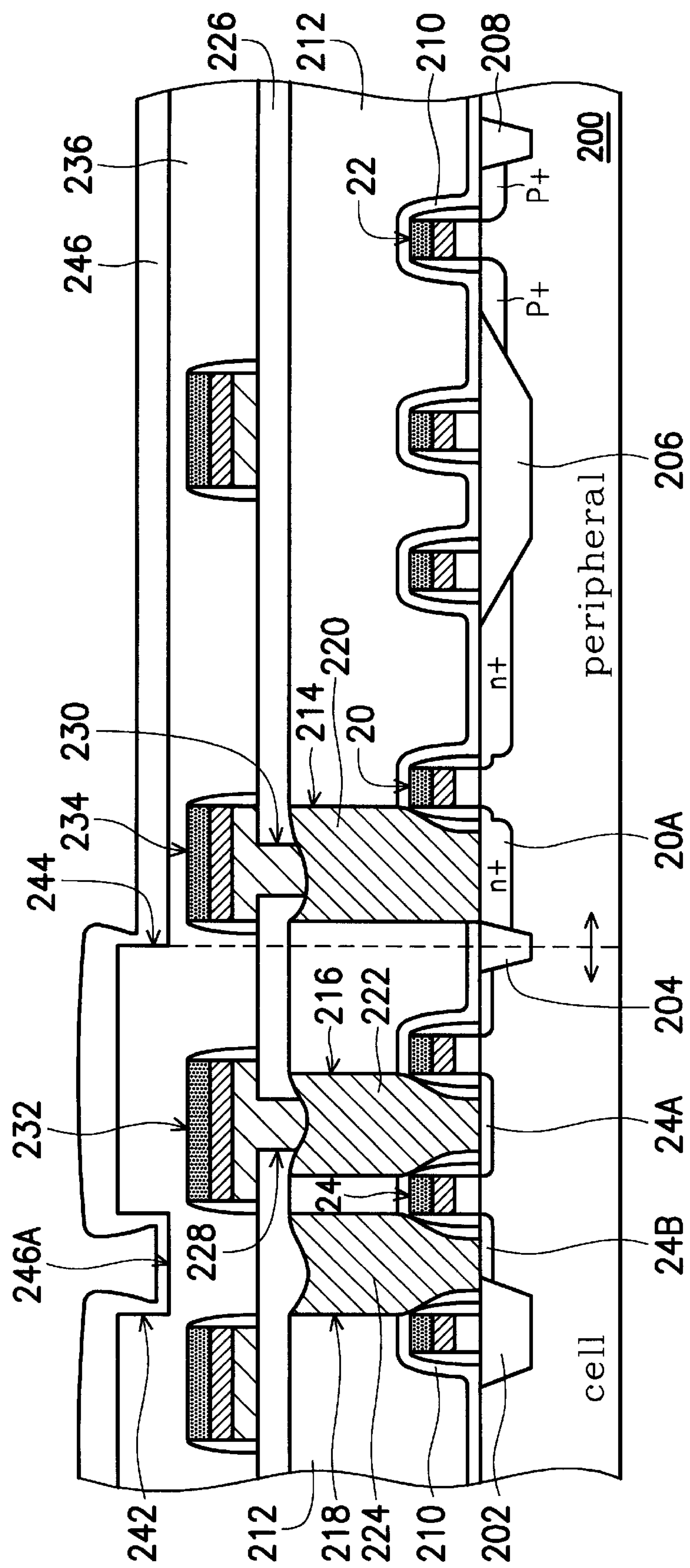

Subsequently, a capping layer 246 is conformably deposited over the insulating layer 236. Preferably, the capping layer 246 is a silicon nitride layer of about 400~1000 Å formed by means of a plasma-enhanced chemical vapor deposition (PECVD) process. Because the width of the trench 242 is in the range of deep sub-micron, the portion 246A on the bottom of the trench 242 may have a thickness less than 20% of the other portion outside the trench 242 due to poor step coverage, as shown in FIG. 1C. Thus, the capping portion 246A may have the thinner thickness of about 50~200 Å.

Figure 1D:
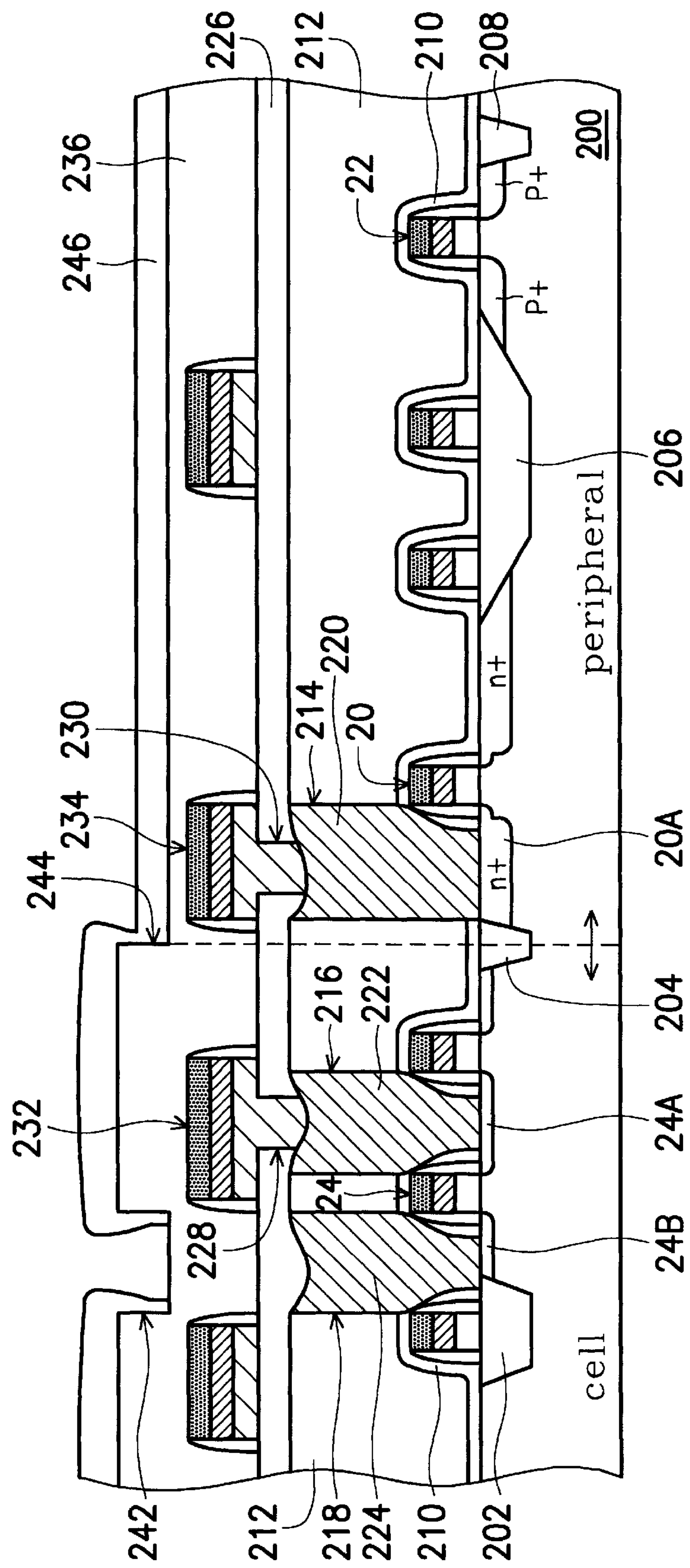

The capping portion 246A on the bottom of the trench 242 is thereafter removed, for example, by an etching step, to expose the underlying insulating layer 236 as shown in FIG. 1D. However, because the overall capping layer 246 is subjected to the etching process, the capping layer 246 on the sidewall of the trench 242 and that within the recess 244 is etched and thinned to the thickness range of about 300~700 Å.

Figure 1E:
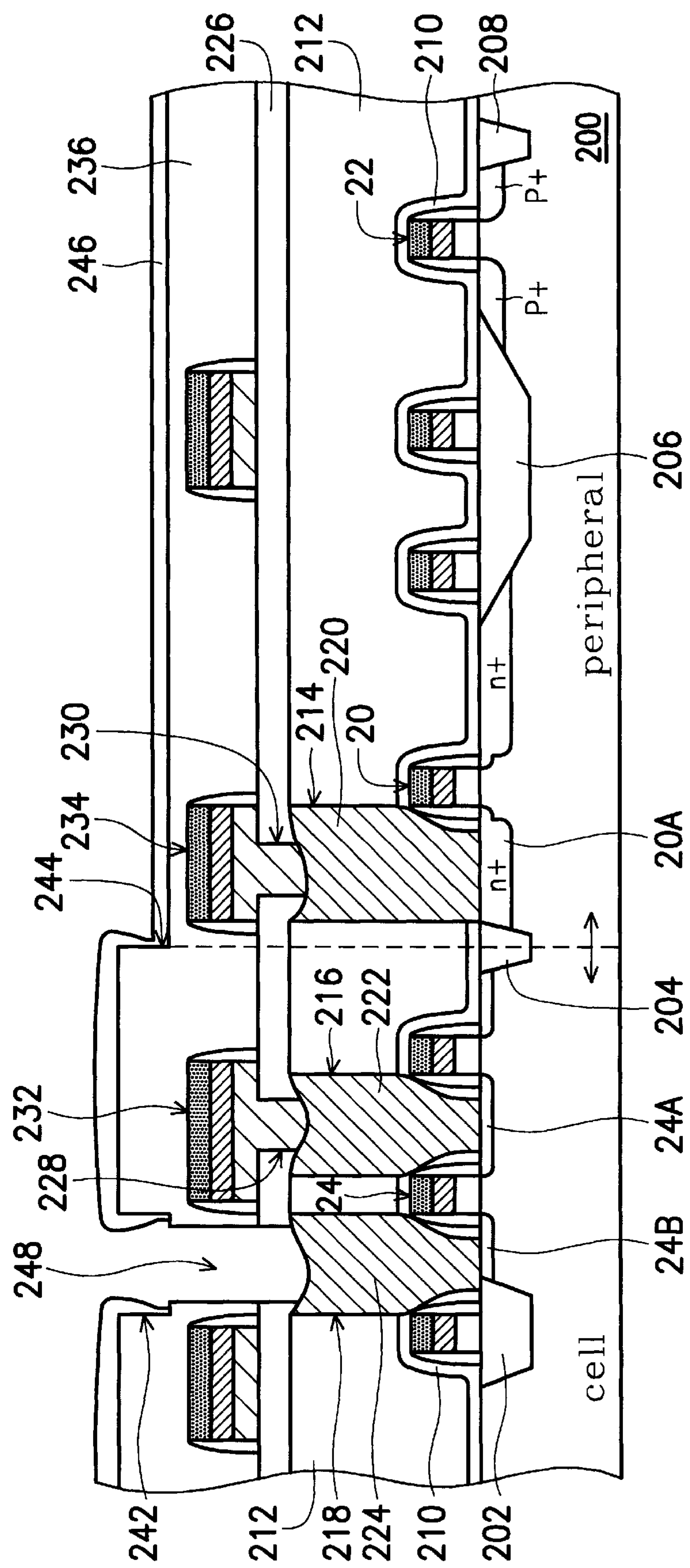

Next, as shown in FIG. 1E, by taking the remaining capping layer 246 as masking, the insulating layers 236 and 226 are sequentially etched to form a storage node contact window 248 to expose the landing plug 224. If both the insulating layers 226 and 236 are made of silicon oxide, and the capping layer 246 is made of silicon nitride, the applied etchant can have an $SiO_x/SiN_x$ etching selectivity rate of about 15/1~25/1 to form the storage node contact window 248. In addition, despite slower etching rate the capping layer 246 is subjected to the etching process in the formation of the storage node contact window 248 so that the capping layer 246 of FIG. 1E is thinner than that depicted in FIG. 1D.

Figure 1F:
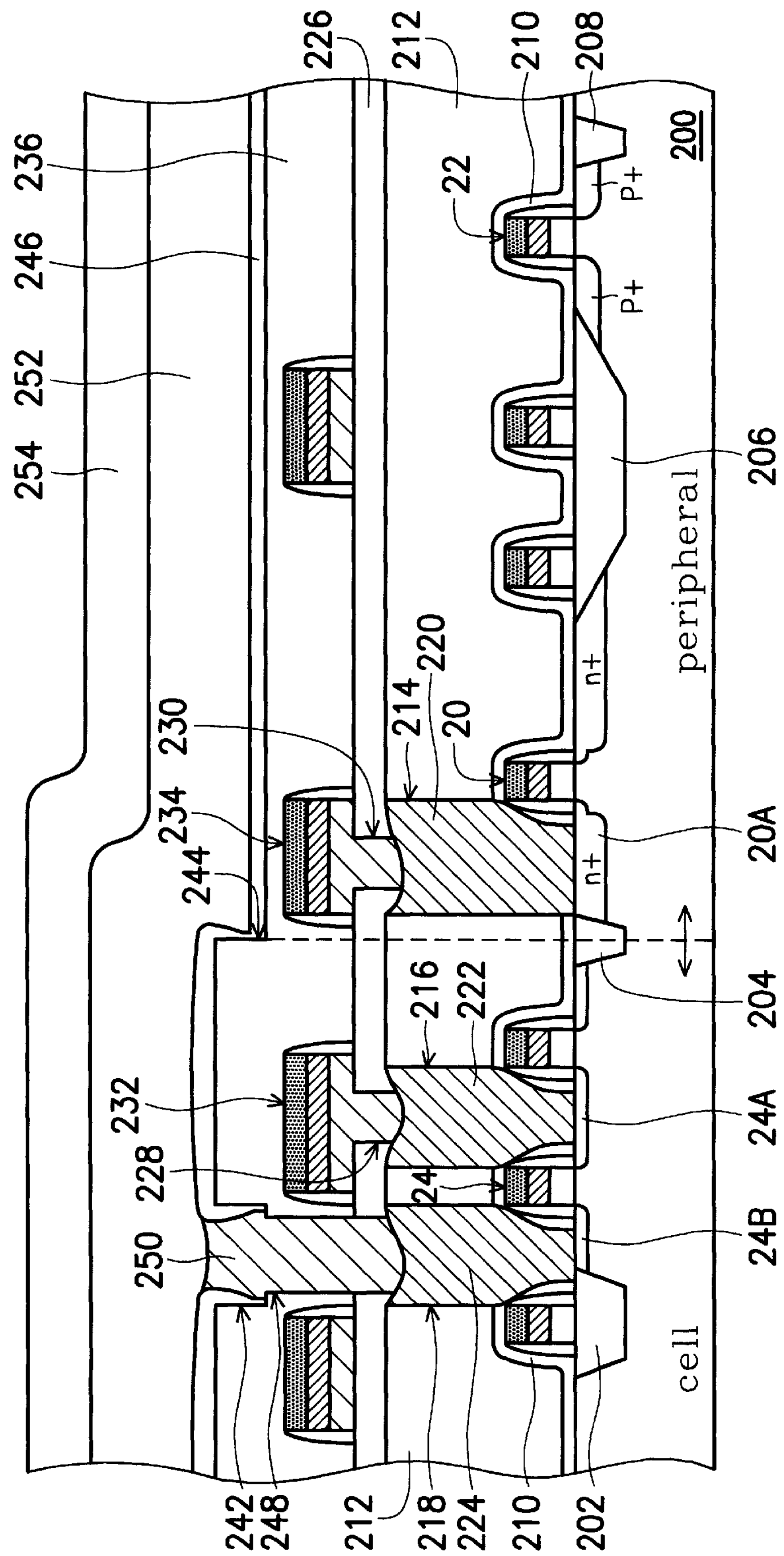

Then, a landing plug 250 is formed and filled in the storage node contact window 248 in contact with the landing plug 224. Preferably, the landing plug 250 consists of polysilicon doped with impurities to increase conductivity. Next, as shown in FIG. 1F, two insulating layers 252 and 254 are sequentially deposited to overlie the cell area and the peripheral circuit area. According to the present invention, the etching selectivity rate of the insulating layer 254 to the insulating layer 252 should be significant when the insulating layer 254 is subjected to patterning and etching in the following steps. For example, the insulating layer 252 can be a borophosphosilicate glass (BPSG) layer with a thickness of about 5000~8000 Å; the insulating layer 254 can be made of undoped oxide, such as undoped TEOS-oxide, with a thickness of about 3000~5000 Å.

Figure 1G:
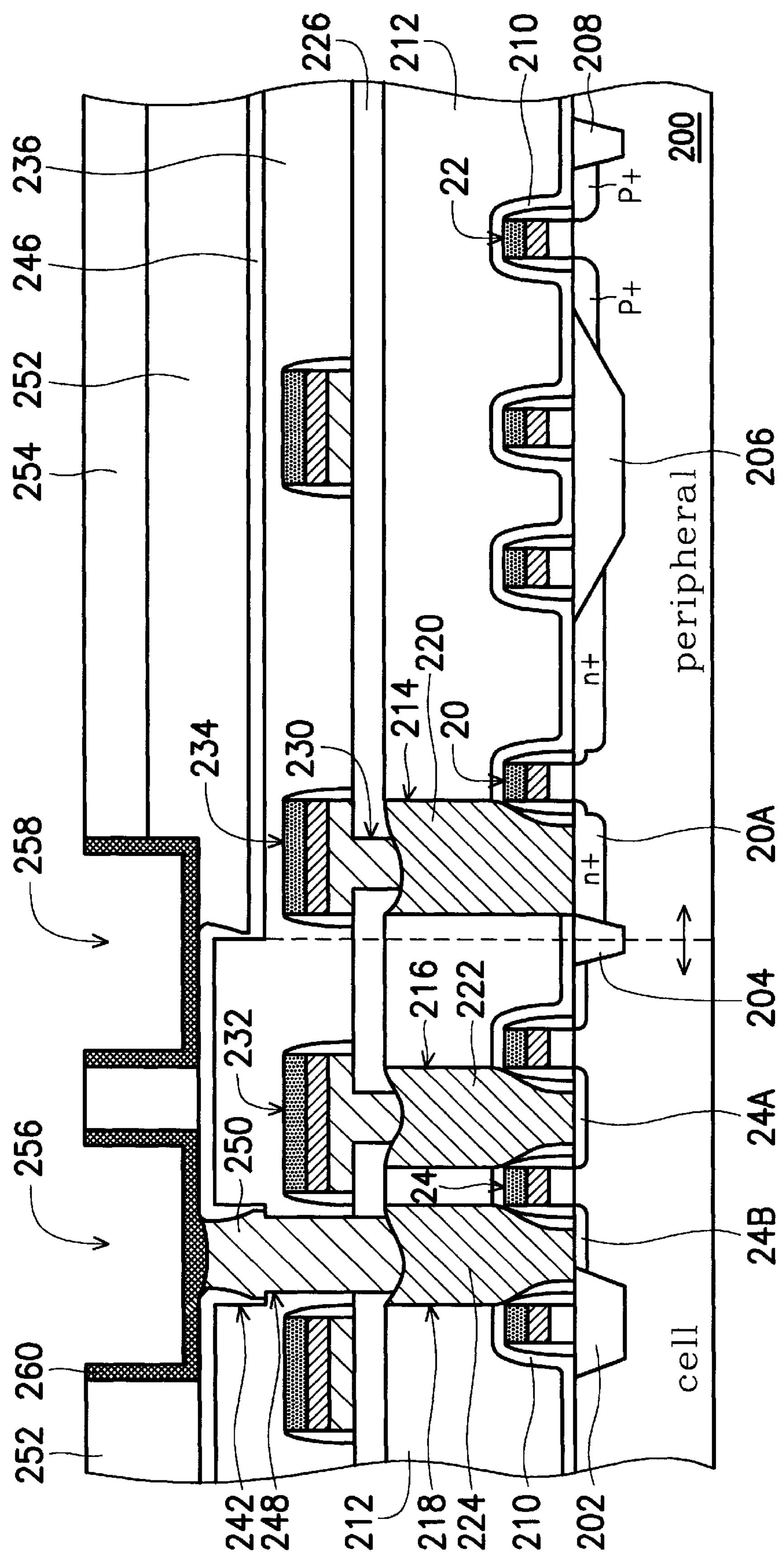

Next, by means of photolithography and etching processes, the insulating layers 254 and 252 are patterned and etched to form two wide openings 256 and 258, wherein the opening 256 is used to expose the landing plug 250 and wider than the landing plug 250. After a polysilicon layer 260 with a thickness of about 500~1000 Å is conformably deposited, a planarization process, such as CMP, is applied to remove the insulating layer 254 of the cell area. Due to the formation of the recess 244 at the peripheral circuit area as shown in FIG. 1B, a portion of the insulating layer 254 of the peripheral circuit area remains as shown in FIG. 1G.

Figure 1H:
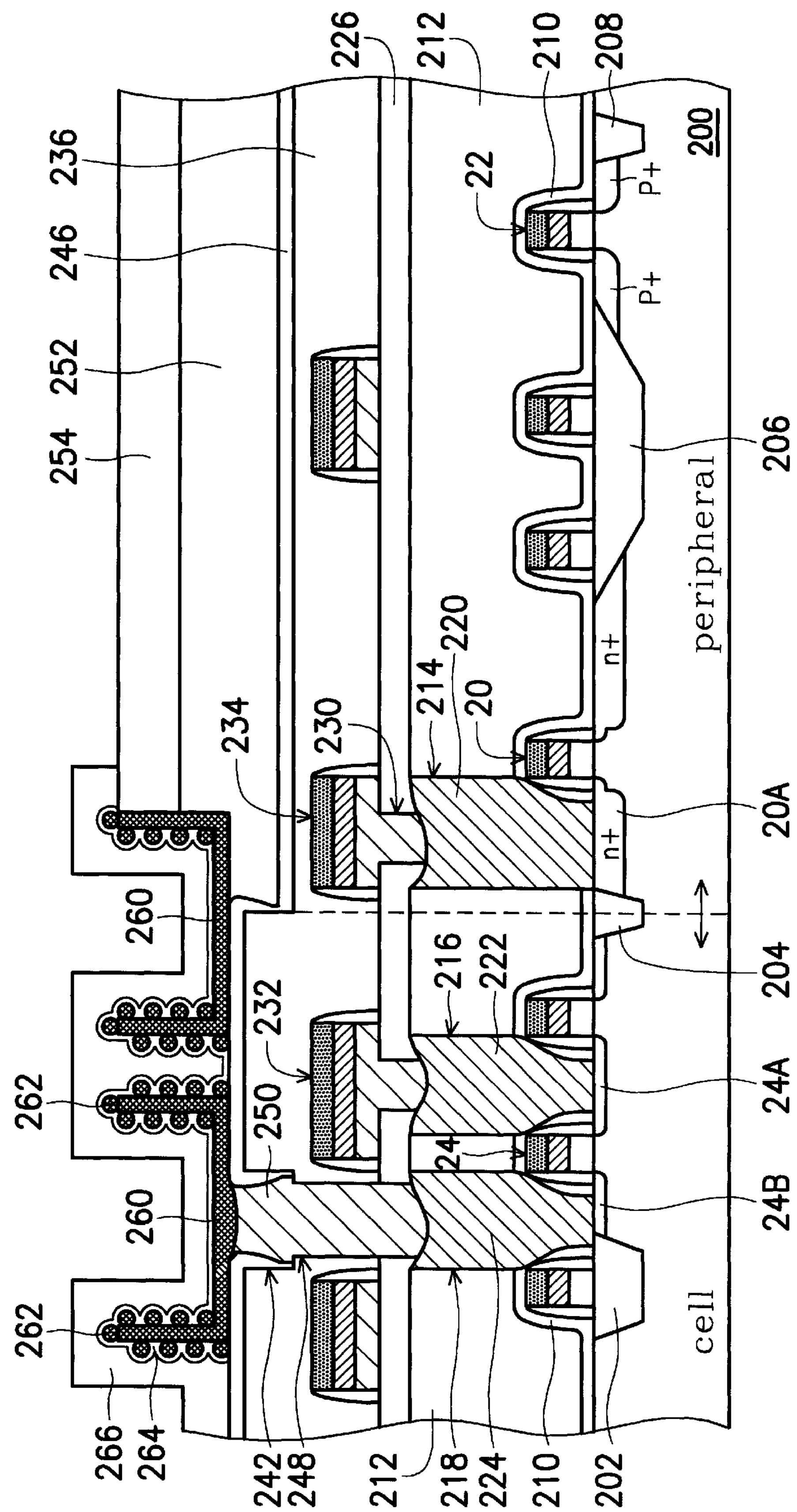

Subsequently, by taking the insulating layer 254 as masking, the insulating layer 252 in the cell area is removed so that the polysilicon layer 260 is shaped like a crown to be the bottom electrode of the fabricated capacitor. If the insulating layer 252 is of BPSG, the insulating 252 can be etched by vapor hydrofluoric acid. For further increasing capacitance, a plurality of hemispherical grains 262 can be selectively formed on the surface of the polysilicon layer 260. Then, a dielectric layer 264 of oxide/nitride/oxide, preferably, is conformably formed on the polysilicon layer 262. A polysilicon layer 266 is deposited on the dielectric layer 264, and thereafter patterned and etched by means of photolithography and etching processes to be the upper electrode of the fabricated capacitor as shown in FIG. 1H. In a word, the polysilicon layers 260 and 266 in conjunction with the dielectric layer 264 constitutes the fabricated crown capacitor.

In conclusion, the planarization process of the present invention makes use of the recess 244 create a step height at the boundary of the cell area and the peripheral circuit area. Because the planarization process has been applied in the step as shown in FIG. 1G, no additional planarization process is required after the inner sidewall and outer sidewall of the bottom electrode 260 is exposed in the step of FIG. 1H. Moreover, because the insulating layer 254 overlies the peripheral circuit area, no extra photoresist layer is required when the insulating layer 252 in the cell area is to be removed to expose the inner sidewall and outer sidewall of the bottom electrode 260.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A method for fabricating an integrated circuit having a cell area and a peripheral circuit area in a semiconductor substrate, said method comprising the following steps of:

(a) forming a memory device and a transistor within said cell area and said peripheral circuit area, respectively, wherein said memory device has a doped region formed in said semiconductor substrate;

(b) forming a first insulating layer overlying said cell area and said peripheral circuit area;

(c) patterning said first insulating layer to form a trench over said doped region and a recess in said peripheral circuit area;

(d) patterning said first insulating layer through said trench to form a contact window;

(e) forming a landing plug in said contact window in contact with said doped region;

(f) sequentially forming a second insulating layer and a third insulating layer overlying said cell area and said peripheral circuit area;

(g) patterning said second insulating layer and said third insulating layer to form an opening over said doped region;

(h) forming a first conductive layer on the bottom and sidewall of said opening in contact with said landing plug;

(i) removing said third insulating layer in said cell area by a planarization process;

(j) removing said second insulating layer in said cell area;

(k) forming a dielectric layer on said first conductive layer; and (l) forming a second conductive layer on said dielectric layer.

2. The method as claimed in claim 1, further comprising a step between the steps (a) and (b) of forming at least one bit line over said memory device, wherein said at least one bit line is electrically connected to another doped region of said memory device through another landing plug.

3. The method as claimed in claim 1, further comprising the steps between the steps (c) and (d) of:

conformably forming a silicon nitride layer overlying said cell area and said peripheral circuit area; and removing a portion of said silicon nitride layer on the bottom of said trench.

4. The method as claimed in claim 1, wherein said second insulating layer is a BPSG layer.

5. The method as claimed in claim 4, wherein said second insulating layer has a thickness of about 5000~8000 Å.

6. The method as claimed in claim 4, wherein said third insulating layer is an undoped oxide layer.

7. The method as claimed in claim 6, wherein said third insulating layer has a thickness of about 3000~5000 Å.

8. The method as claimed in claim 1, wherein said first conductive layer is a polysilicon layer.

9. The method as claimed in claim 8, wherein said first conductive layer has a thickness of about 500~1000 Å.

10. The method as claimed in claim 8, further comprising a step between the steps (j) and (k) of selectively forming a plurality of hemispherical grains on said first conductive layer.

11. The method as claimed in claim 1, wherein said trench and said recess have a thickness of about 2000~4000 Å.

12. A method for fabricating an integrated circuit having a cell area and a peripheral circuit area in a semiconductor substrate, said method comprising the following steps of:

(a) forming a memory device and a transistor within said cell area and said peripheral circuit area, respectively, wherein said memory device has a doped region formed in said semiconductor substrate;

(b) forming an insulating layer overlying said cell area and said peripheral circuit area;

(c) patterning said insulating layer to form a trench over said doped region and a recess in said peripheral circuit area;

(d) patterning said insulating layer through said trench to form a contact window;

(e) forming a landing plug in said contact window in contact with said doped region;

(f) sequentially forming a BPSG layer and an undoped oxide layer overlying said cell area and said peripheral circuit area;

(g) patterning said undoped oxide layer and said BPSG layer to form an opening over said doped region;

(h) forming a first conductive layer on the bottom and sidewall of said opening in contact with said landing plug;

(i) removing said undoped oxide layer in said cell area by a planarization process;

(j) removing said BPSG layer in said cell area;

(k) forming a dielectric layer on said first conductive layer; and (l) forming a second conductive layer on said dielectric layer.

13. The method as claimed in claim 12, further comprising the steps between the steps (c) and (d) of:

conformably forming a silicon nitride layer overlying said cell area and said peripheral circuit area; and removing a portion of said silicon nitride layer on the bottom of said trench.

14. The method as claimed in claim 12, wherein said BPSG layer has a thickness of about 5000~8000 Å.

15. The method as claimed in claim 12, wherein said undoped oxide layer has a thickness of about 3000~5000 Å.

16. The method as claimed in claim 12, wherein said first conductive layer is a polysilicon layer.

17. The method as claimed in claim 16, wherein said first conductive layer has a thickness of about 500~1000 Å.

18. The method as claimed in claim 16, further comprising a step between the steps (j) and (k) of selectively forming a plurality of hemispherical grains on said first conductive layer.

19. The method as claimed in claim 12, wherein said trench and said recess have a thickness of about 2000~4000 Å.

20. The method as claimed in claim 12, wherein the undoped oxide layer in said peripheral circuit area is utilized as masking in the step (j).

* * * * *